United States Patent
Su et al.

(10) Patent No.: US 10,937,489 B2
(45) Date of Patent: Mar. 2, 2021

(54) PRE-CHARGE CIRCUIT OF SRAM CONTROLLER AND PRE CHARGING METHOD THEREOF

(71) Applicant: Novatek Microelectronics Corp., Hsinchu (TW)

(72) Inventors: Pin-Han Su, Hsinchu County (TW); Jen-Hao Liao, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 16/747,559

(22) Filed: Jan. 21, 2020

(65) Prior Publication Data

US 2020/0302997 A1    Sep. 24, 2020

Related U.S. Application Data

(60) Provisional application No. 62/820,859, filed on Mar. 20, 2019.

(51) Int. Cl.
| | | |
|---|---|---|
| *G11C 11/41* | (2006.01) | |
| *G11C 11/419* | (2006.01) | |
| *G11C 7/12* | (2006.01) | |
| *G11C 11/4091* | (2006.01) | |

(52) U.S. Cl.
CPC ............ *G11C 11/419* (2013.01); *G11C 7/12* (2013.01); *G11C 11/4091* (2013.01); *G11C 2207/12* (2013.01)

(58) Field of Classification Search
CPC ... G11C 7/12; G11C 11/4091; G11C 2207/12; G11C 11/419
See application file for complete search history.

(56) References Cited

U.S. PATENT DOCUMENTS

| | | | |
|---|---|---|---|
| 2008/0181038 A1* | 7/2008 | Clinton | G11C 11/419 365/203 |
| 2015/0098267 A1* | 4/2015 | Jain | G11C 11/419 365/154 |

* cited by examiner

*Primary Examiner* — Han Yang
(74) *Attorney, Agent, or Firm* — JCIPRNET

(57) ABSTRACT

A pre-charge circuit of a static random access memory (SRAM) controller and a pre-charging method thereof are provided. The pre-charge circuit of the SRAM controller includes a first switch, a second switch and a third switch. A first terminal of the first switch is coupled to a working voltage, a second terminal of the first switch is coupled to a first bit line of the SRAM controller, and the first switch is controlled by a first turn-on signal. A first terminal of the second switch is coupled to the working voltage, a second terminal of the second switch is coupled to a second bit line of the SRAM controller, and the second switch is controlled by a second turn-on signal. The third switch is coupled between the first bit line and the second bit line, and the third switch is controlled by a third turn-on signal. In a pre-charge mode, a time point at which the third switch is turned on is earlier than a time point at which the first switch is turned on and earlier than a time point at which the second switch is turned on.

12 Claims, 9 Drawing Sheets

PRE-CHARGE CIRCUIT OF SRAM CONTROLLER AND PRE CHARGING METHOD THEREOF

CROSS-REFERENCE TO RELATED APPLICATION

This application claims the priority benefits of U.S. provisional application Ser. No. 62/820,859, filed on Mar. 20, 2019. The entirety of the above-mentioned patent application is hereby incorporated by reference herein and made a part of specification.

BACKGROUND

Field of the Invention

The invention relates to a static random access memory (SRAM) controller and more particularly, to a pre-charge circuit of an SRAM controller and a pre-charging method thereof.

Description of Related Art

FIG. 1 is a schematic diagram illustrating a currently available static random access memory (SRAM) unit and a pre-charge circuit thereof. FIG. 1 illustrates an SRAM 110 and a pre-charge circuit 120 thereof. Data is stored in the SRAM 110 through a filp-flop structure (composed of inverters I1 and I2). On or off states of transistors N1 and N2 in the SRAM 110 are controlled by a signal of a word line W, such that data to be written is transmitted to a bit line BL and a reverse signal line BLB thereof, and then, the data is read out through the bit line BL. When the SRAM 110 does not perform a writing operation or a reading operation, transistors P1 to P3 in the pre-charge circuit 120 are controlled by a pre-charge signal PRE to pre-charge a potential of the bit line to a level of a power supply voltage VDD. Nevertheless, as the bit line BL of the pre-charge circuit 120 and the reverse signal line BLB thereof share a control signal, which may lead to a large transient current during an operation of the circuit.

In order to save a peak current during the operation of the circuit, a person skilled in the art may add a secondary pre-charge circuit to the structure illustrated in FIG. 1. FIG. 2 is a schematic diagram illustrating a currently available SRAM unit and pre-charge circuits thereof. FIG. 2 illustrates an SRAM 210, a primary pre-charge circuit 220 and a secondary pre-charge circuit 230. Structures and operational details of the SRAM 210 and the primary pre-charge circuit 220 may be inferred with reference to the descriptions related to the SRAM 110 and the pre-charge circuit 120 thereof illustrated in FIG. 1 and thus, will not be repeated. In comparison with FIG. 1, the secondary pre-charge circuit 230 is added in the embodiment illustrated in FIG. 2. A structure of the secondary pre-charge circuit 230 is similar to the structure of the primary pre-charge circuit 220, and a circuit size of the secondary pre-charge circuit 230 is smaller than that of the primary pre-charge circuit 220. When the pre-charge signal PRE is enabled, a potential of the bit line is pre-charged to the level of the power supply voltage VDD first by turning on the secondary pre-charge circuit 230. Following that, the primary pre-charge circuit 220 may be turned on by a pre-charge signal PRE_DLY, thereby completing a complete pre-charging operation. The pre-charge signal PRE_DLY is delayed by a delay component 201 to be later than the pre-charge signal PRE. Because the circuit size of the secondary pre-charge circuit 230 is smaller, a peak current of the secondary pre-charge circuit 230 when being pre-charged is a smaller than that of the structure illustrated in FIG. 1.

FIG. 3 is a schematic diagram illustrating a currently available SRAM unit array and pre-charge circuits thereof. FIG. 3 illustrates a plurality of SRAMs 310, a plurality of primary pre-charge circuits 320 and a plurality of secondary pre-charge circuits 330. Structures and operational details of the SRAMs 310, the primary pre-charge circuits 320 and the secondary pre-charge circuits 330 may be inferred with reference to the descriptions related to the SRAM 210, the primary pre-charge circuit 220 and the secondary pre-charge circuit 230 illustrated in FIG. 2 and thus, will not be repeated. According to FIG. 3, each SRAM 310 is required to be configured with a primary pre-charge circuit 320 and a secondary pre-charge circuit 330, which results in a larger overall circuit size of the SRAM controller.

In brief, among the currently available techniques, a currently available SRAM device when being operated has a larger circuit transient current, and as a result, device operating margin will be reduced with large voltage drop during SRAM operating. In order to reduce the circuit transient current by increasing the number of the secondary pre-charge circuits, an overall circuit size of the SRAM device raises, which leads to increased costs and failure to meet the trend of product miniaturization.

SUMMARY

The invention provides a pre-charge circuit of a static random access memory (SRAM) controller and a pre-charging method thereof capable of reducing a circuit transient current and reducing an overall circuit size to be smaller than the structure illustrated in FIG. 3.

A pre-charge circuit of an SRAM controller of the invention includes a first switch, a second switch and a third switch. A first terminal of the first switch is coupled to a working voltage, a second terminal of the first switch is coupled to a first bit line of the SRAM controller, and the first switch is controlled by a first turn-on signal. A first terminal of the second switch is coupled to the working voltage, a second terminal of the second switch is coupled to a second bit line of the SRAM controller, and the second switch is controlled by a second turn-on signal. The third switch is coupled between the first bit line and the second bit line, and the third switch is controlled by a third turn-on signal. In a pre-charge mode, a time point at which the third switch is turned on is earlier than a time point at which the first switch is turned on and earlier than a time point at which the second switch is turned on.

A pre-charging method of an SRAM controller of the invention includes the following steps. A first turn-on signal is received by a first switch to turn on the first switch, and a working voltage is transmitted to a first bit line of the SRAM controller. A second turn-on signal is received by a second switch to turn on the second switch, and the working voltage is transmitted to a second bit line of the SRAM controller. A third turn-on signal is received by a third switch to turn on the third switch, and a voltage of the first bit line and a voltage the second bit line are equalized. In a pre-charge mode, a time point at which the third switch is turned on is earlier than a time point at which the first switch is turned on and earlier than a time point at which the second switch is turned on.

Based on the above, the invention can achieve reducing a transient current through a newly disposed timing control circuit, so as to reduce the power consumption and prevent the circuit components from being damaged while the overall circuit size of the SRAM device is considered.

In order to make the aforementioned features and advantages of the invention more comprehensible, embodiments accompanying figures are described in details below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 3:
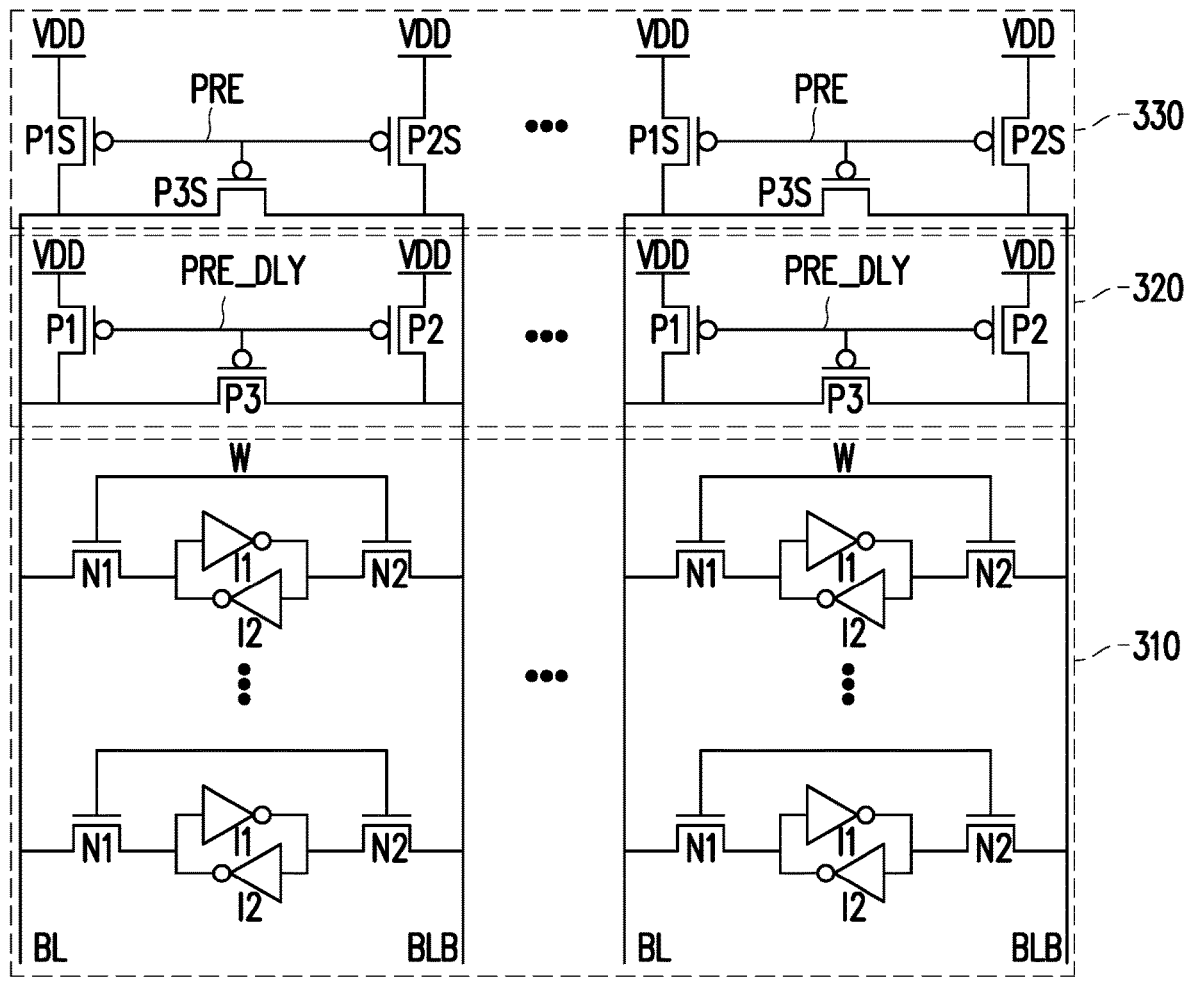
FIG. 3 is a schematic diagram illustrating a currently available SRAM unit array and pre-charge circuits thereof.
Figure 4:
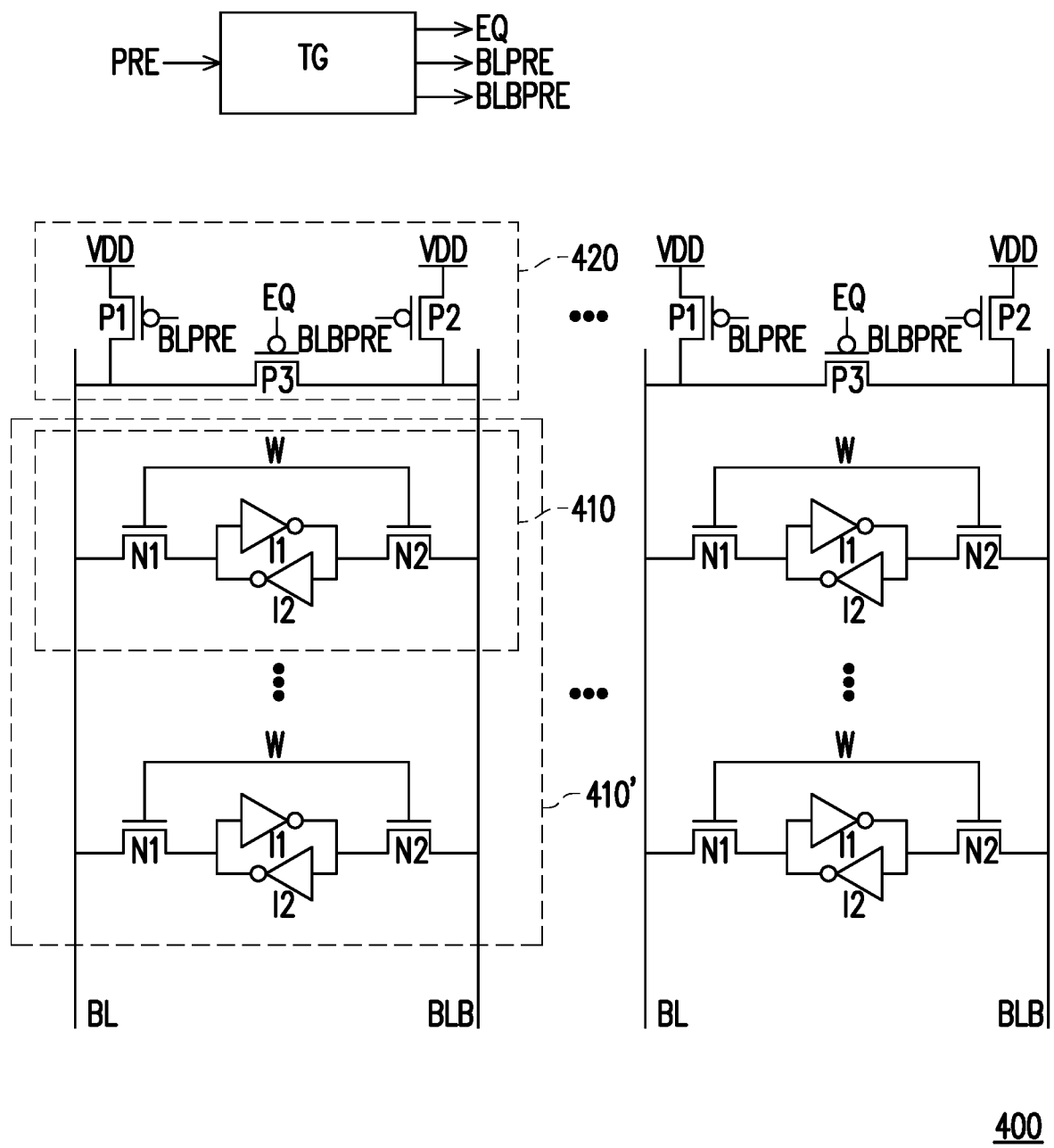
FIG. 4 is a schematic diagram illustrating a current SRAM unit array and pre-charge circuits thereof according to an embodiment of the invention.

FIG. 4 is a schematic diagram illustrating a static random access memory (SRAM) unit array and pre-charge circuits thereof according to an embodiment of the invention. Referring to FIG. 4, a static random access memory (SRAM) unit array includes a plurality of SRAM unit columns 410', and each of the SRAM unit columns 410' further includes a plurality of SRAM units 410. Each of the SRAM unit columns 410' is configured with a pre-charge circuit 420. A structure and operation details of the SRAM units 410 may be inferred with reference to description related to the SRAM 310 illustrated in FIG. 3 and thus, will not be repeated.

The pre-charge circuit 420 includes transistors P1 to P3. A first terminal of the transistor P1 is coupled to a power supply voltage VDD, and a second terminal of the transistor P1 is coupled to a bit line BL. A first terminal of the transistor P2 is coupled to the power supply voltage VDD, and a second terminal of the transistor P2 is coupled to a reverse bit line BLB. A first terminal and a second terminal of the transistor P3 are respectively coupled to the second terminal of the transistor P1 and the second terminal of the transistor P2. Control terminals of the transistors P1 to P3 respectively receive a pre-charge signal BLPRE, a pre-charge signal BLBPRE and a control signal EQ. That is to say, the transistors P1 to P3 are respectively controlled by the pre-charge signal BLPRE, the pre-charge signal BLBPRE and the control signal EQ to be turned on or turned off. In the present embodiment, the transistors P1 to P3 may be implemented by P-type metal-oxide-semiconductor field-effect transistors (MOSFETs). However, the invention is not limited thereto, and any type of transistors capable of turning on and off should pertain to the scope of the invention.

The embodiment illustrated in FIG. 4 features in a timing control circuit TG generating the pre-charge signal BLPRE, the pre-charge signal BLBPRE and the control signal. Comparing the embodiments illustrated in FIG. 3 and FIG. 4, each SRAM unit illustrated in FIG. 3 has to be additionally disposed with a secondary pre-charge circuit 330, while only one timing control circuit TG is additionally disposed in the invention which causes limited influence to an overall circuit size of the SRAM controller. Thus, the overall circuit size illustrated in FIG. 4 is much smaller than that illustrated in FIG. 3.

Figure 5A:
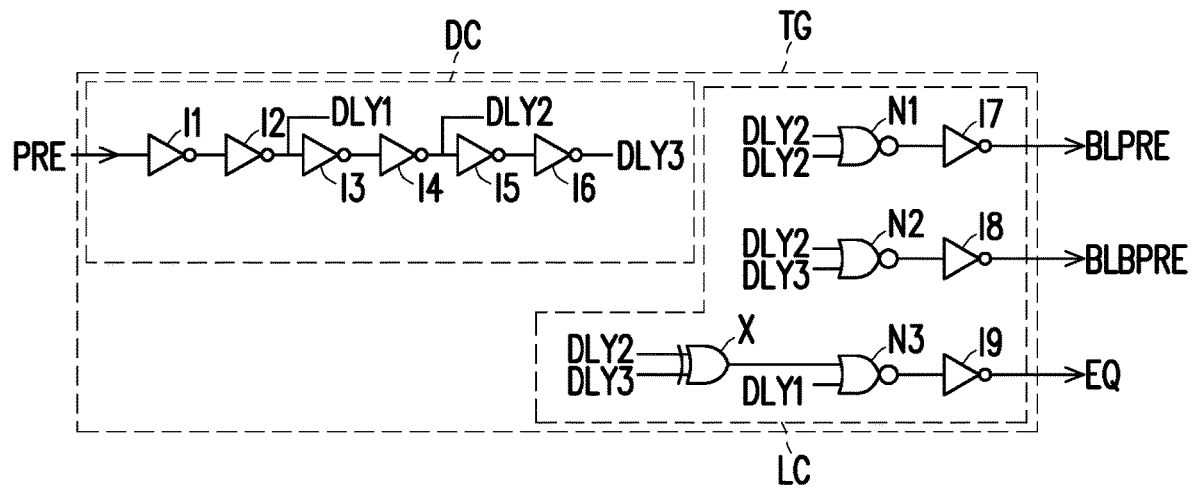
FIG. 5A is a schematic diagram illustrating the timing control circuit according to an embodiment of the invention.

FIG. 5A is a schematic diagram illustrating the timing control circuit according to an embodiment of the invention. Referring to FIG. 5, the timing control circuit TG includes a delay circuit DC and a logic circuit LC. The delay circuit DC includes a plurality of inverters I1 to I6 which are cascaded to form a delay path. The inverters I1 to I6 are employed as delay components. The delay circuit DC receives a pre-charge signal PRE. The pre-charge signal PRE is delayed by the inverters I1 and I2 to generate a delay signal DLY1. The pre-charge signal PRE is delayed by the inverters I1 to I4 to generate a delay signal DLY2. The pre-charge signal PRE is delayed by the inverters I1 to I6 to generate a delay signal DLY3. Specifically, after the pre-charge signal PRE is enabled (e.g., changed from a high-voltage level to a low-voltage level), the delay signals DLY1 to DLY3 which are all at low-voltage levels are sequentially generated to serve as input signals of the logic circuit LC.

Figure 5B:
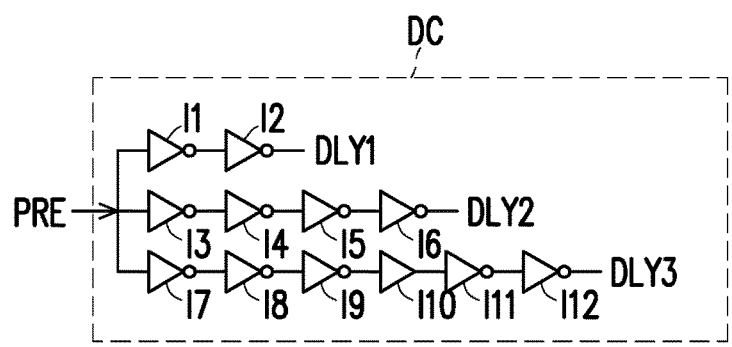
FIG. 5B illustrates the delay circuit according to an embodiment of the invention.

It should be mentioned that the invention is not limited to the manner that the delay signals are generated via one delay path. Moreover, the number and the configuration of the delay components are also not limited in the invention, and a circuit designer may vary the number of the delay components and the configuration thereof according to actual demands. FIG. 5B illustrates the delay circuit DC according to an embodiment of the invention. Referring to FIG. 5B, the delay circuit DC includes three delay paths configured to generate the delay signals DLY1 to DLY3, respectively. A first delay path among the three delay paths includes two delay components (i.e., the inverters I1 and I2) to generate the delay signal DLY1. A second delay path among the three delay paths includes four delay components (i.e., the inverters I3 to I6) to generate the delay signal DLY2. A third delay path among the three delay paths includes six delay components (i.e., the inverters I7 to I12) to generate the delay signal DLY3. Or, alternatively, as illustrated in FIG. 5B, the number of the delay components included by the first delay path may be changed into 3, the number of the delay components included by the second delay path may be changed into 6, and the number of the delay components included by the third delay path may be changed into 9. In other embodiments, the number of the delay paths that are included may also be two, a first delay path of the two delay paths is configured to generate the delay signals DLY1 and DLY2, and a second delay path of the two delay paths is configured to generate a delay signal DLY3.

Referring to FIG. 5A again, the logic circuit LC includes NOR gates N1 to N3, an XOR gate X and inverters I7 to I9. Both a first input terminal and a second input terminal of the NOR gate N1 receive the delay signal DLY2. A first input terminal of the NOR gate N2 receives the delay signal DLY2, and a second input terminal of the NOR gate N2 receives the delay signal DLY3. A first input terminal of the XOR gate X receives the delay signal DLY2, and a second input terminal of the XOR gate X receives the delay signal DLY3. A first input terminal of the NOR gate N3 receives an output signal from the XOR gate X, and a second input terminal of the NOR gate N3 receives the delay signal DLY1. The inverters I7 to I9 respectively receives output signals from the NOR gates N1, N2 and N3 to generate the pre-charge signal BLPRE, the pre-charge signal BLBPRE and the control signal EQ, respectively.

Figure 6:
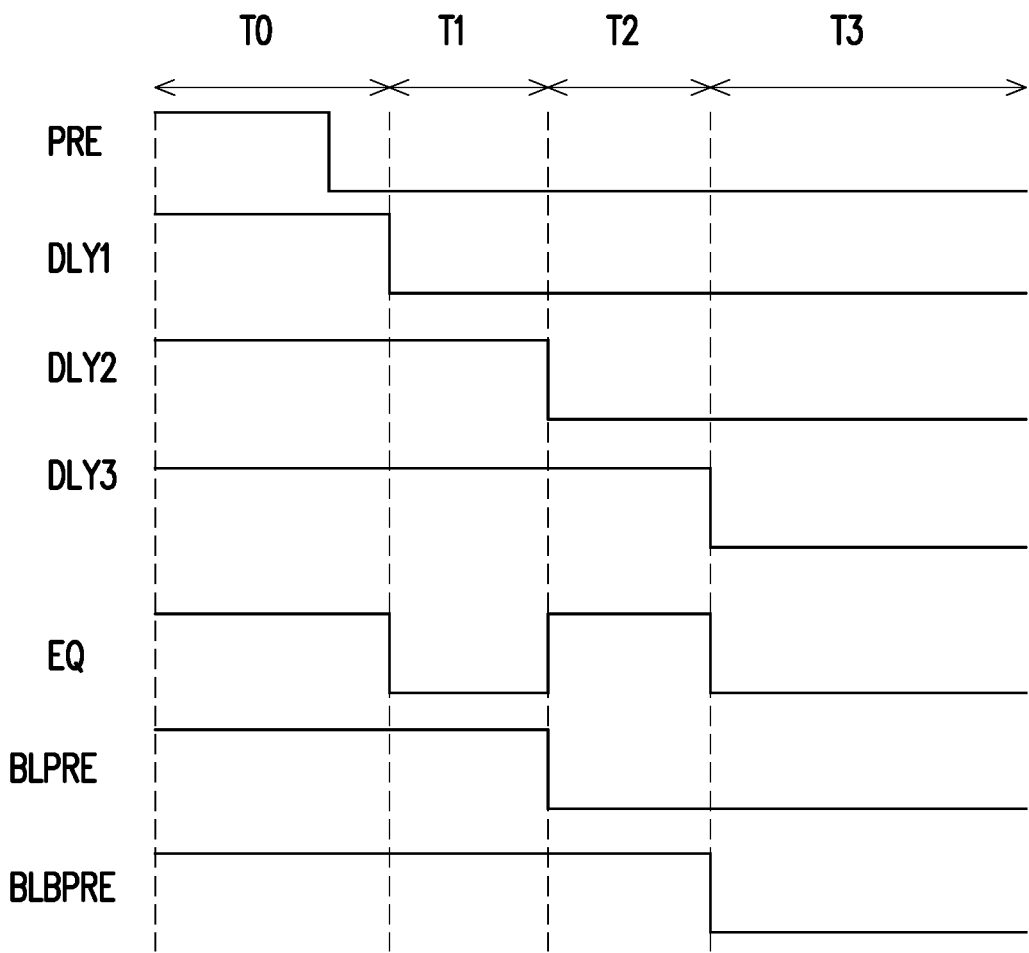
FIG. 6 is a timing diagram illustrating all the signals depicted in FIG. 5A.

FIG. 6 is a timing diagram illustrating all the signals depicted in FIG. 5A. Referring to FIG. 6, at a start time point of a period T0, the pre-charge signal PRE is not yet enabled (i.e., at a high-voltage level). At the end of the period T0, the pre-charge signal PRE is enabled (i.e., transited into a low-voltage level). After a delay time following the enablement of the pre-charge signal PRE, the delay signal DLY1 is then transited from a high-voltage level to a low-voltage level (referring to an end time point of the period T0). From a start time point of a period T1 to an end time point of a period T3, the delay signal DLY1 is maintained at the low-voltage level. The delay signals DLY2 and DLY3 are transited from high-voltage levels to low-voltage levels respectively at an end time point of the period T1 and at an end time point of the period T2.

Referring to FIG. 5A and FIG. 6 simultaneously, during the period T0, the delay signals DLY1 to DLY3 are all at the high-voltage levels. Thus, the output signals from the XOR gate X and the NOR gate N3 are all at low-voltage levels, and an output signal (i.e., the control signal EQ) from the inverter I9 is at a high-voltage level. During the period T1, the delay signal DLY1 is at the low-voltage level, and the delay signals DLY2 and DLY3 are both maintained at the high-voltage levels. Thus, a voltage level of the output signal from the NOR gate N3 is changed into a high-voltage level and is transited into a low-voltage level through the inverter I9 (the control signal EQ is transited into a low-voltage level). During the period T2, the delay signals DLY1 and DLY2 are both at the low-voltage levels, and the delay signal DLY3 is still maintained at the high-voltage level. Thus, a voltage level of the output signal from the XOR gate X is changed into a high-voltage level, and the voltage level of the output signal from the NOR gate N3 is changed into a low-voltage level and is transited into a high-voltage level through the inverter I9 (the control signal EQ returns back to the high-voltage level again). During the period T3, the delay signals DLY1 to DLY3 are all at the low-voltage levels. Thus, the voltage level of the output signal from the XOR gate X is changed into a low-voltage level, the voltage level of the output signal from the NOR gate N3 is changed into a high-voltage level and is transited into a low-voltage level through the inverter I9 (the control signal EQ returns back to the low-voltage level again).

Regarding transition of the voltage levels of the pre-charge signals BLPRE and BLBPRE depicted in FIG. 6, as the operation manners of logic gates are well known to the persons skilled in the art, the transition process of the voltage levels of the pre-charge signals BLPRE and BLBPRE illustrated in FIG. 6 may be inferred according to the descriptions related to the embodiment illustrated in FIG. 5A and thus, will not be repeated. According to FIG. 6, the voltage level of the pre-charge signal BLPRE is transited from a high-voltage level to a low-voltage level at the end time point of the period T1. The voltage level of the pre-charge signal BLBPRE is transited from a high-voltage level to a low-voltage level at the end time point of the period T2. That is to say, in the invention, the voltage levels of the control signal EQ and the pre-charge signals BLPRE and BLBPRE may be changed in the ways as described above by the timing control circuit TG. An operational relationship among the timing control circuit TG, the pre-charge circuit 420 and the SRAM units 410 is described below.

Figure 7A:
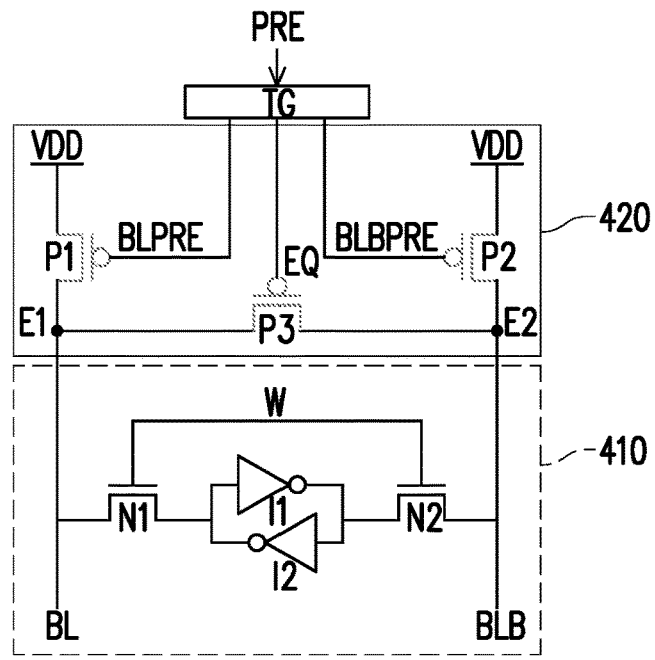
FIG. 7A is a schematic diagram illustrating the timing control circuit, the pre-charge circuit and the SRAM unit are in a first stage according to an embodiment of the invention.

FIG. 7A is a schematic diagram illustrating the timing control circuit, the pre-charge circuit and the SRAM unit are in a first stage according to an embodiment of the invention. Referring to FIG. 7A, in the first stage (corresponding to the period T0), the SRAM unit 410 just has completed a reading operation, the pre-charge signal PRE is not yet enabled, and the voltage levels of the control signal EQ and the pre-charge signals BLPRE and BLBPRE generated by the timing control circuit TG are all at the high-voltage levels, causing all of the transistors P1 to P3 to be turned off. In this circumstance, the bit line BL is at a high-voltage level, and the reverse bit line BLB is at a low-voltage level. That is to say, nodes E1 and E2 are respectively at a high-voltage level (e.g., 1 V) and a low-voltage level (e.g., 0 V).

Figure 7B:
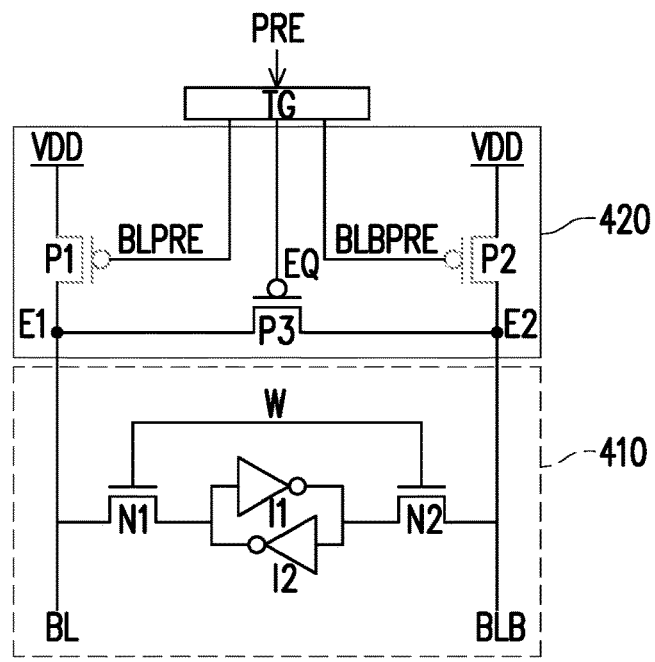
FIG. 7B is a schematic diagram illustrating the timing control circuit, the pre-charge circuit and the SRAM unit are in a second stage according to an embodiment of the invention.

FIG. 7B is a schematic diagram illustrating the timing control circuit, the pre-charge circuit and the SRAM unit are in a second stage according to an embodiment of the invention. Referring to FIG. 7B, in the second stage (corresponding to the period T1), the pre-charge signal PRE is enabled (e.g., transited from a high-voltage level to a low-voltage level), the control signal EQ generated by the timing control circuit TG is at a low-voltage level, and the pre-charge signals BLPRE and BLBPRE are both at high-voltage levels, causing the transistor P3 to be turned on while the transistors P1 and P2 are still in the off state. In this circumstance, as the transistor P3 is turned on, the voltage level of the bit line BL drops, and the voltage level of the reverse bit line BLB raises, such that both are in consistency with each other. For example, a voltage of the node E1, for example, drops from 1 V to 0.5 V, and a voltage of the node E2 is, for example, boosted from 0 V to 0.5 V.

Figure 7C:
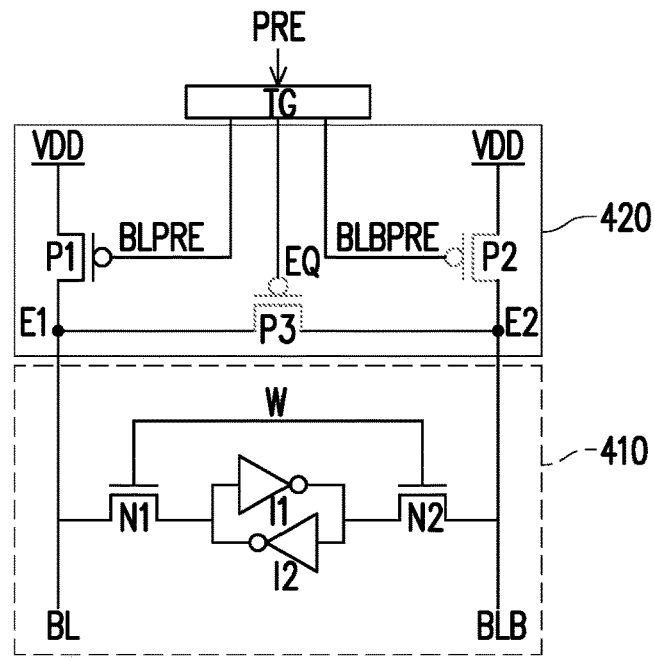
FIG. 7C is a schematic diagram illustrating the timing control circuit, the pre-charge circuit and the SRAM unit are in a third stage according to an embodiment of the invention.

FIG. 7C is a schematic diagram illustrating the timing control circuit, the pre-charge circuit and the SRAM unit are in a third stage according to an embodiment of the invention. Referring to FIG. 7C, in the third stage stage (corresponding to the period T2), the voltage levels of the control signal EQ and the pre-charge signal BLBPRE generated by the timing control circuit TG are both at high-voltage levels, and the pre-charge signal BLPRE is at a high-voltage level, causing the transistor P1 to be turned on, while the transistors P2 and P3 are turned off. In this circumstance, as the transistor P1 is turned on, the voltage level of the bit line BL is boosted to the level of the power supply voltage VDD. For example, the voltage of the node E1 is, for example, boosted from 0.5 V to 1 V, and the voltage of the node E2 is still maintained at 0.5 V.

Figure 7D:
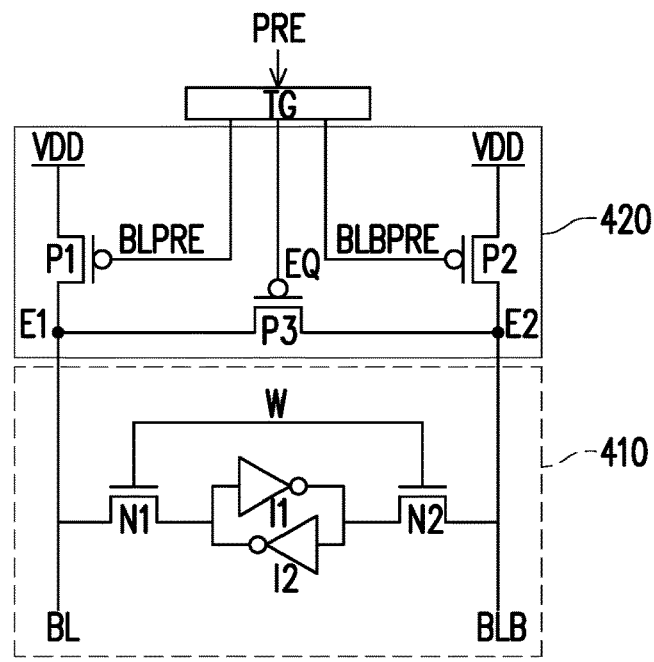
FIG. 7D is a schematic diagram illustrating the timing control circuit, the pre-charge circuit and the SRAM unit are in a fourth stage according to an embodiment of the invention.

FIG. 7D is a schematic diagram illustrating the timing control circuit, the pre-charge circuit and the SRAM unit are in a fourth stage according to an embodiment of the invention. Referring to FIG. 7D, in the fourth stage (corresponding to the period T3), the voltage levels of the control signal EQ and the pre-charge signals BLBPRE and BLPRE generated by the timing control circuit TG are all at low-voltage levels, causing all of the transistors P1 to P3 to be turned on. In this circumstance, as the transistor P1 is turned on, the voltage level of the bit line BL is maintained at the level of the power supply voltage VDD. As the transistor P2 is turned on, the voltage level of the reverse bit line BLB is boosted to the level of the power supply voltage VDD. Additionally, as the transistor P3 is turned on, even in a condition that there is slight difference between the bit line BL and the reverse bit line BLB due to noise or other factors, the voltages of the bit line BL and the reverse bit line BLB still may achieve consistency. For example, the voltage of the node E1 is maintained at 1V, and the voltage of the node E2 is boosted from 0.5 V to 1 V.

Regarding the structure and the operational details of each of the components illustrated in FIG. 7A to FIG. 7D, they may be inferred with reference to the descriptions related to the components named in the same way in the embodiments illustrated in FIG. 4 and FIG. 5A and thus, will not be repeated. It should be additionally mentioned that for the convenience to distinguish the on state and the off state of the transistors, in FIG. 7A to FIG. 7D, the transistors in the off state are presented in gray.

Figure 8:
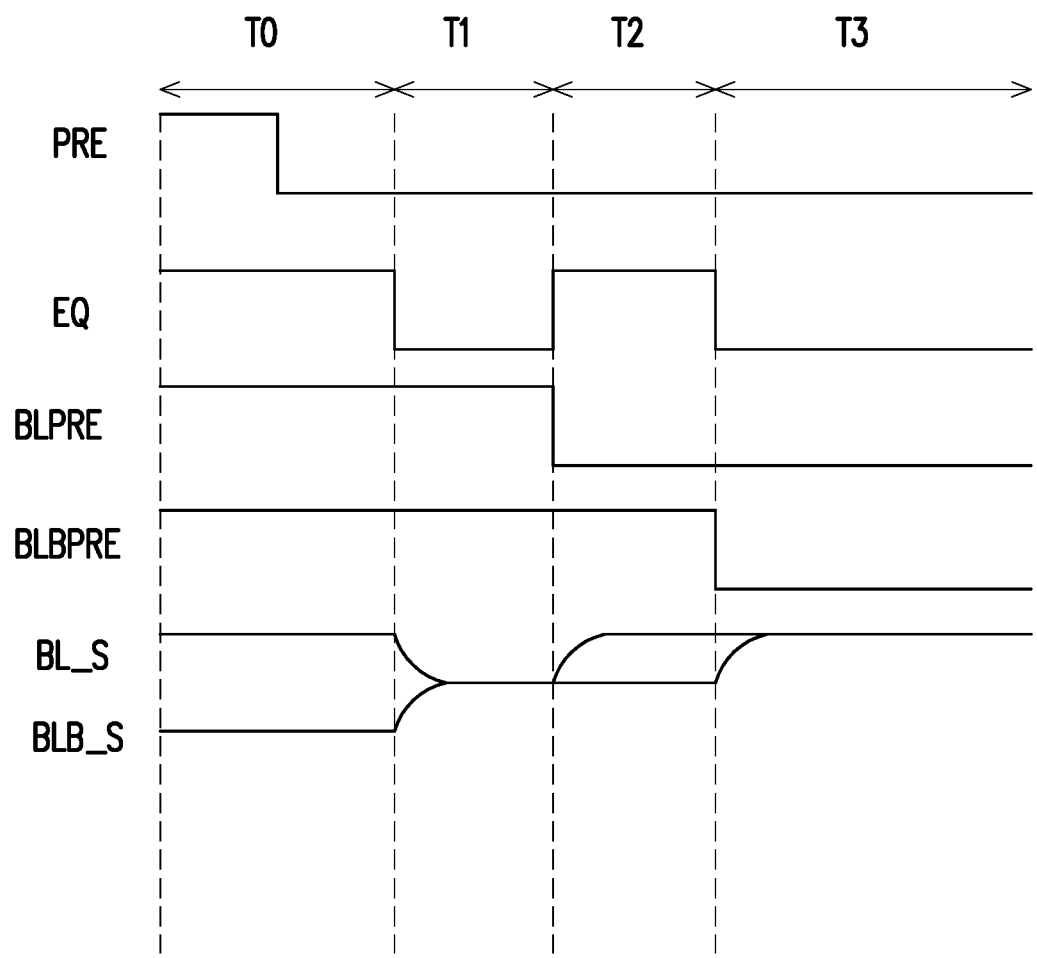
FIG. 8 is a schematic diagram illustrating the signals of the bit line and the reverse bit line of the embodiment depicted in FIG. 7A-7D.

FIG. 8 is a schematic diagram illustrating the signals of the bit line BL and the reverse bit line BLB of the embodiment depicted in FIG. 7A-7D. FIG. 8 illustrates a charge signal PRE, a control signal EQ, a charge signal BLPRE and a charge signal BLBPRE for showing the comparison. Regarding the charge signal PRE, the control signal EQ, the charge signal BLPRE and the charge signal BLBPRE illustrated in FIG. 8, they may be inferred with reference to the descriptions related to the embodiment illustrated in FIG. 6 and thus, will not be repeated. Referring to FIG. 7A and FIG. 8 simultaneously, during the period T1, a bit line BL_S is at a high-voltage level (e.g., 1 V), and a reverse bit line BLB_S is at a low-voltage level (e.g., 0V). Referring to FIG. 7B and FIG. 8 simultaneously, during the period T1, the transistor P3 is turned on to achieve an effect of equalization, the bit line BLB_S and the reverse bit line BLB_S tend to be consistent with each other (e.g., 0.5V). Referring to FIG. 7C and FIG. 8 simultaneously, during the period T2, the voltage level of the bit line BL_S is boosted to the level of the power supply voltage VDD (e.g., 1 V), and the voltage of the reverse bit line BLB_S is not changed (e.g., maintained at 0.5 V). Referring to FIG. 7D and FIG. 8 simultaneously, during the period T3, the voltage of the bit line BL_S is not changed (e.g., maintained at 1 V), and the voltage level of the bit line BLB_S is boosted to the level of the power supply voltage VDD (e.g., 1 V).

Figure 1:
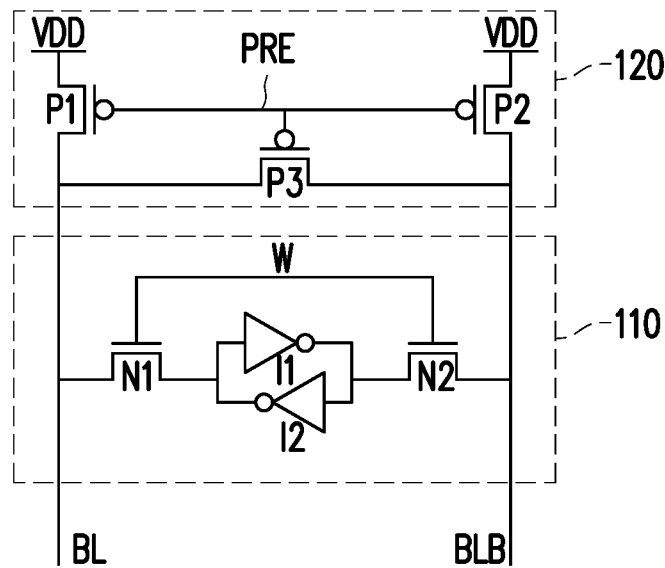
FIG. 1 is a schematic diagram illustrating a currently available static random access memory (SRAM) unit and a pre-charge circuit thereof.
Figure 9:
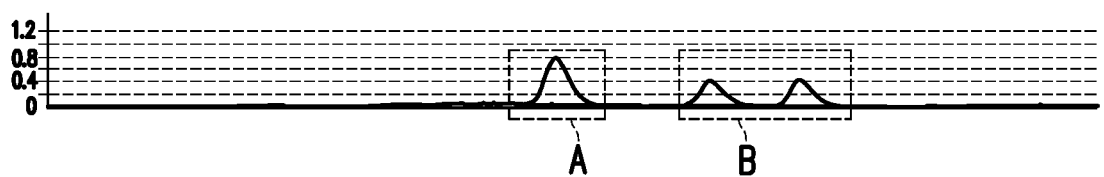
FIG. 9 is a schematic diagram comparing the peak current of the circuit of the invention and the peak current of the circuit illustrated in FIG. 1.

In this way, a transient current during a circuit operation may be reduced by separating pre-charge timings of the bit line BL and the reverse bit line BLB from each other, while the overall circuit size is also considered in the invention. FIG. 9 is a schematic diagram comparing a peak current of the circuit of the invention and the peak current of the circuit illustrated in FIG. 1, wherein the horizontal axis represents the time, and the vertical axis represents the peak current. According to FIG. 9, the size of the peak current generated by the circuit illustrated in FIG. 1 is as shown by area A, which is about 0.8 A. A size of a peak current generated by the circuit of the invention is as shown by area B, which is about 0.4 A. That is to say, compared with the current technique, the invention may achieve reducing the size of the peak current by up to 50%, while the overall circuit size is considered.

Figure 2:
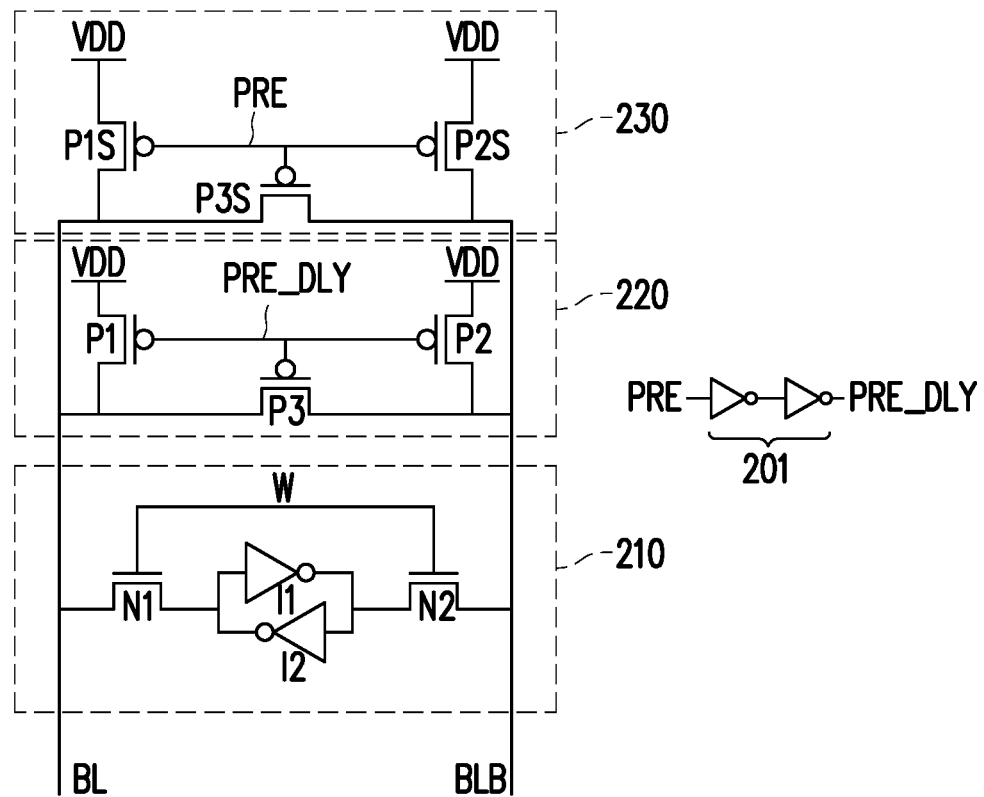
FIG. 2 is a schematic diagram illustrating a currently available SRAM unit and pre-charge circuits thereof.
Figure 10:
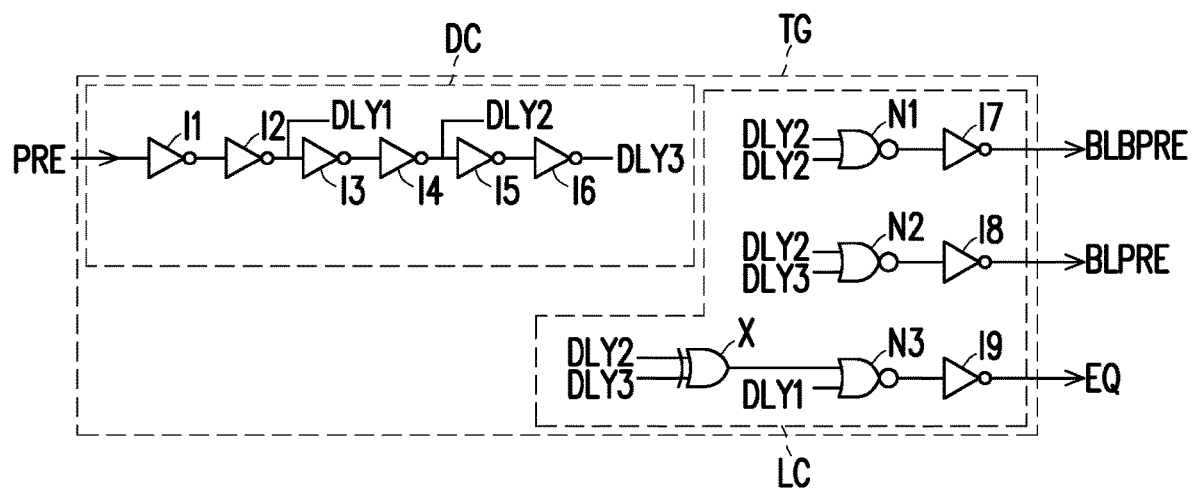
FIG. 10 illustrates a modification example of FIG. 5A.
Figure 11:
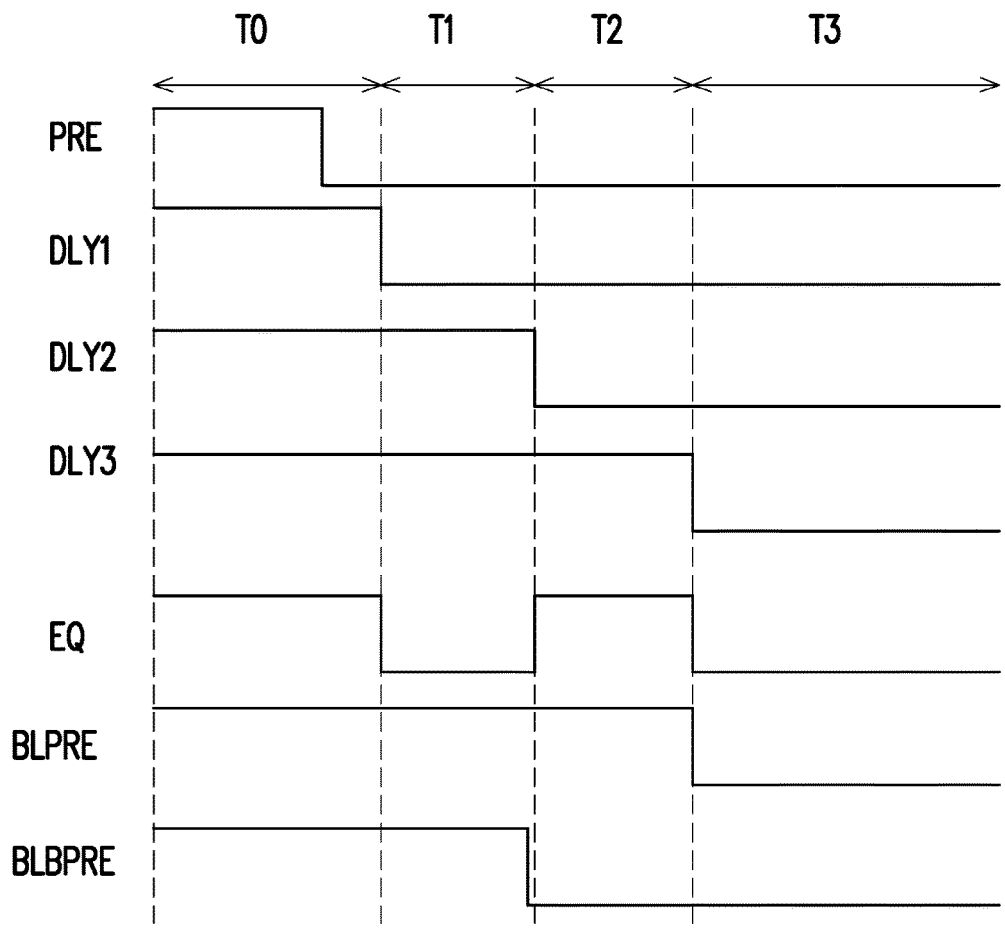
FIG. 11 is a timing diagram illustrating all the signals in FIG. 10.

FIG. 10 illustrates a modification example of FIG. 5A. The difference between the embodiments illustrated in FIG. 10 and FIG. 2A merely lies in that the output signal from the inverter I7 is employed as the pre-charge signal BLBPRE, and the output signal from the inverter 18 is employed as the pre-charge signal BLPRE. FIG. 11 is a timing diagram illustrating all the signals in FIG. 10. The difference between the embodiments illustrated in FIG. 11 and FIG. 6 lies in that the pre-charge signal BLPRE illustrated in FIG. 11 is transited from a high-voltage level to a low-voltage level at the end time point of the period T2, and the pre-charge signal BLBPRE is transited from a high-voltage level to a low-voltage level at the end time point of the period T1. That is to say, the key to the sequence of turning on the transistors P1 to P3 (referring to any one of the embodiments illustrated in FIG. 4 and FIG. 7A to FIG. 7D) lies in that the transistor P3 has to be turned on first, and the transistors P1 and P2 are turned on only after the transistor P3 is turned on. Nevertheless, the sequence in which the transistors P1 and P2 are turned on is not limited.

Based on the above, the can achieve separating the timings of turning on the transistors from each other in the pre-charge circuit by an additionally disposed timing control circuit, thereby first equalizing the voltages of the bit line with the reverse bit line and then, sequentially boosting the voltage levels of the bit line and the reverse bit line to the level of the power supply voltage. In this way, the invention can achieve effectively reducing the transient current during the operation of the SRAM controller, so as to reduce the power consumption and prevent the circuit components from being damaged while the overall circuit size is also considered.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A pre-charge circuit of a static random access memory (SRAM) controller, comprising:
   a first switch, having a first terminal coupled to a working voltage source and a second terminal coupled to a first bit line of the SRAM, and the first switch being controlled by a first turn-on signal;
   a second switch, having a first terminal coupled to the working voltage source and a second terminal coupled to a second bit line of the SRAM, and the second switch being controlled by a second turn-on signal; and
   a third switch, coupled between the first bit line and the second bit line, and the third switch being controlled by a third turn-on signal,
   wherein in a pre-charge mode, a time point at which the third switch is turned on is earlier than a time point at which the first switch is turned on and earlier than a time point at which the second switch is turned on.

2. The pre-charge circuit of the SRAM controller according to claim 1, wherein the time point at which the first switch is turned on is earlier than the time point at which the second switch is turned on.

3. The pre-charge circuit of the SRAM controller according to claim 1, wherein the time point at which the second switch is turned on is earlier than the time point at which the first switch is turned on.

4. The pre-charge circuit of the SRAM controller according to claim 1, wherein the pre-charge circuit further comprises:
a timing control circuit, configured to generate the first turn-on signal, the second turn-on signal and the third turn-on signal.

5. The pre-charge circuit of the SRAM controller according to claim 4, wherein the timing control circuit comprises:
a delay circuit, configured to delay a pre-charge signal to generate a first delay signal, a second delay signal and a third delay signal; and
a logical circuit, configured to generate the first turn-on signal, the second turn-on signal and the third turn-on signal according to the first delay signal, the second delay signal and the third delay signal,
wherein when the delay circuit receives the pre-charge signal, the pre-charge circuit starts the pre-charge mode.

6. The pre-charge circuit of the SRAM controller according to claim 5, wherein the delay circuit comprises:
a first delay set, comprising at least one first delay component and generating the first delay signal according to the pre-charge signal;
a second delay set, comprising a plurality of second delay components and generating the second delay signal according to the pre-charge signal;
a third delay set, comprising a plurality of third delay components and generating the third delay signal according to the pre-charge signal,
wherein the number of the at least one first delay component is less than that of the second delay components, the number of the at least one first delay component is less than that of the third delay components, and the number of the second delay components is less than that of the third delay components.

7. The pre-charge circuit of the SRAM controller according to claim 5, wherein the delay circuit comprises:
a first delay set, comprising at least one first delay component and generating the first delay signal according to the pre-charge signal;
a second delay set, comprising at least one second delay component and generating the second delay signal according to the pre-charge signal;
a third delay set, comprising at least one third delay components and generating the third delay signal according to the pre-charge signal,
wherein an input terminal of the second delay set is coupled to an output terminal of the first delay set, and an input terminal of the third delay set is coupled to an output terminal of the second delay set.

8. The pre-charge circuit of the SRAM controller according to claim 5, wherein the logical circuit is further configured to:
perform an OR operation on the second delay signal and the second delay signal and reverse a result of the OR operation to generate the first turn-on signal;
perform an OR operation on the second delay signal and the third delay signal and reverse a result of the OR operation to generate the second turn-on signal; and
compare the second delay signal and the third delay signal, perform an OR operation on the comparison result and the first delay signal and reverse a result of the OR operation to generate the third turn-on signal.

9. The pre-charge circuit of the SRAM controller according to claim 5, wherein the logical circuit is further configured to:
perform an OR operation on the first delay signal and the second delay signal and reverse a result of the OR operation to generate the second turn-on signal;
perform an OR operation on the second delay signal and the third delay signal and reverse a result of the OR operation to generate the first turn-on signal; and
compare the second delay signal and the third delay signal, perform an OR operation on the comparison result and the first delay signal and reverse a result of the OR operation to generate the third turn-on signal.

10. A pre-charging method of a static random access memory (SRAM) controller, comprising:
receiving a first turn-on signal by a first switch to turn on the first switch and transmitting a working voltage to a first bit line of the SRAM;
receiving a second turn-on signal by a second switch to turn on the second switch and transmitting the working voltage to a second bit line of the SRAM; and
receiving a third turn-on signal by a third switch to turn on the third switch and equalizing voltages of the first bit line and the second bit line,
wherein in a pre-charge mode, a time point at which the third switch is turned on is earlier than a time point at which the first switch is turned on and earlier than a time point at which the second switch is turned on.

11. The pre-charging method according to claim 10, wherein the time point at which the first switch is turned on is earlier than the time point at which the second switch is turned on.

12. The pre-charging method according to claim 11, wherein the time point at which the second switch is turned on is earlier than the time point at which the first switch is turned on.

* * * * *